United States Patent [19]

Cederbaum et al.

[11] Patent Number: 5,275,963
[45] Date of Patent: Jan. 4, 1994

[54] METHOD OF FORMING STACKED CONDUCTIVE AND/OR RESISTIVE POLYSILICON LANDS IN MULTILEVEL SEMICONDUCTOR CHIPS AND STRUCTURES RESULTING THEREFROM

[75] Inventors: Carl Cederbaum, Paris; Roland Chanclou, Perthes; Myriam Combes, Evry; Patrick Mone, Ponthierry, all of France

[73] Assignee: International Business Machines Corporation, Armonk, N.Y.

[21] Appl. No.: 728,929

[22] Filed: Jul. 12, 1991

[30] Foreign Application Priority Data

Jul. 31, 1990 [EP] European Pat. Off. ......... 90480108.1

[51] Int. Cl.$^5$ .................. H01L 21/3205; H01L 21/98
[52] U.S. Cl. ..................................... 437/48; 437/228; 437/918; 437/192
[58] Field of Search ..................... 437/43-48; 52; 919; 192-200; 918; 357/71

[56] References Cited

U.S. PATENT DOCUMENTS

| | | | |
|---|---|---|---|
| 4,795,722 | 1/1989 | Welch et al. | 437/192 |
| 4,800,176 | 1/1989 | Kakumu et al. | 437/193 |
| 4,879,257 | 11/1989 | Patrick | 437/195 |
| 4,902,637 | 2/1990 | Kondou et al. | 437/200 |
| 4,960,732 | 10/1990 | Dixit et al. | 437/200 |
| 5,100,817 | 3/1992 | Cederbaum et al. | 437/41 |
| 5,110,762 | 5/1992 | Nakhara et al. | 437/192 |
| 5,112,765 | 5/1992 | Cederbaum et al. | 437/41 |
| 5,128,744 | 7/1992 | Asano et al. | 357/71 |

FOREIGN PATENT DOCUMENTS

| | | |
|---|---|---|
| 0048610 | 9/1981 | European Pat. Off. |
| 8403587 | 9/1984 | European Pat. Off. |
| 0223920 | 6/1987 | European Pat. Off. |
| 20281711 | 9/1988 | European Pat. Off. |
| 0324198 | 7/1989 | European Pat. Off. |
| 0312986 | 10/1987 | Fed. Rep. of Germany |
| 0224158 | 12/1984 | Japan | 257/538 |
| 0213943 | 9/1988 | Japan | 437/915 |

Primary Examiner—Olik Chaudhuri
Assistant Examiner—Richard A. Booth
Attorney, Agent, or Firm—Charles W. Peterson, Jr.

[57] ABSTRACT

A semiconductor structure including: a semiconductor substrate (18/19) having active regions (21) of devices (T1, . . . ) therein and/or polysilicon lines (23-1, . . .) formed thereupon; a first thick passivating layer (26/27) formed above the substrate having a set of first metal contact studs (30-1, . . .) therein contacting at least one of the active regions (21) and/or the polysilicon lines (23-1, . . .); the surface of the first contact studs is coplanar with the surface of the first passivating layer; a plurality of polysilicon lands (31-1, . . .) formed on the planar structure in contact with the first contact studs; the polysilicon lands are either highly resistive, highly conductive or a mix thereof; a second thick passivating layer (34/35) formed above the resulting structure having a set of second metal contact-studs (37-1 . . .) therein contacting at least one of the polysilicon lands and/or one of the first contact studs; the surface of the second contact studs is coplanar with the surface of the second thick passivating layer. a plurality of metal lands (38-1, . . . ) formed above the second thick passivating layer (34/35) in contact with the second contact studs; a final insulating film (39).

The structure of the present invention may be advantageously used in chips implementing four device SRAM cells with stacked polysilicon load resistors (4D/2R SRAM cells) in CMOS FET technology.

The present invention also relates to the method for fabricating the same.

17 Claims, 9 Drawing Sheets

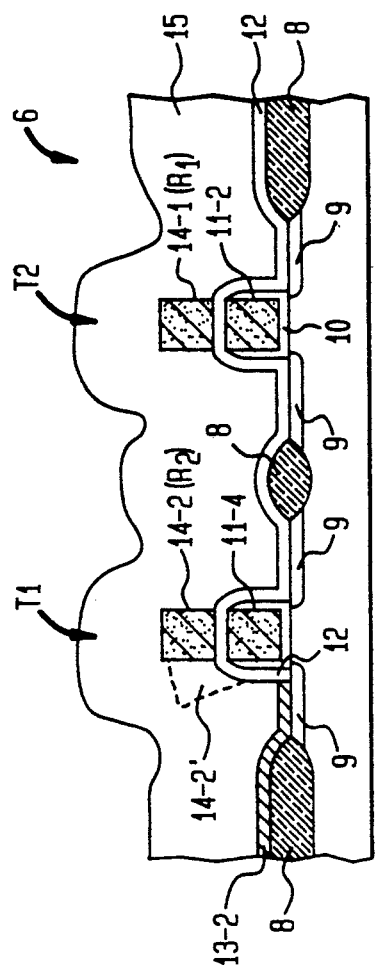
FIG. 2 (PRIOR ART)
FIG. 3 (PRIOR ART)
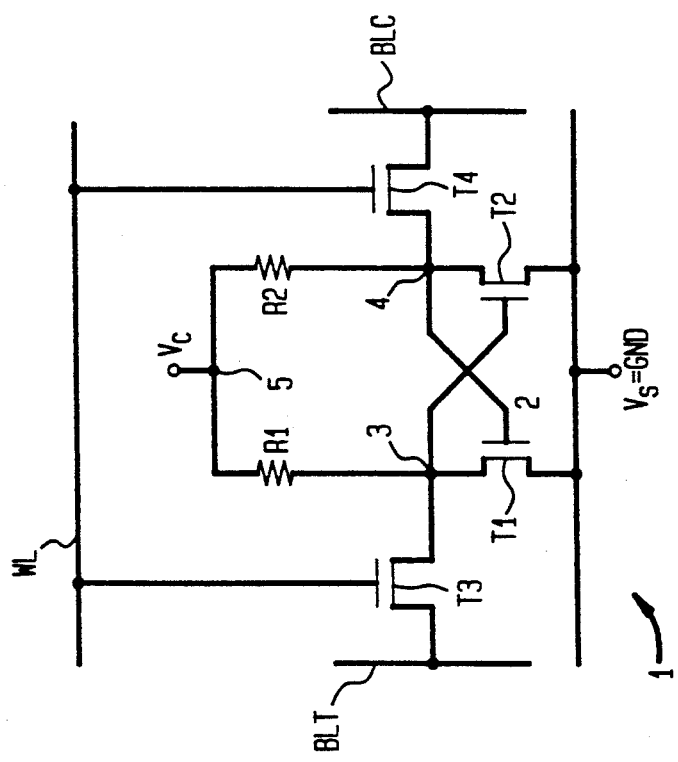
FIG. 1 (PRIOR ART)

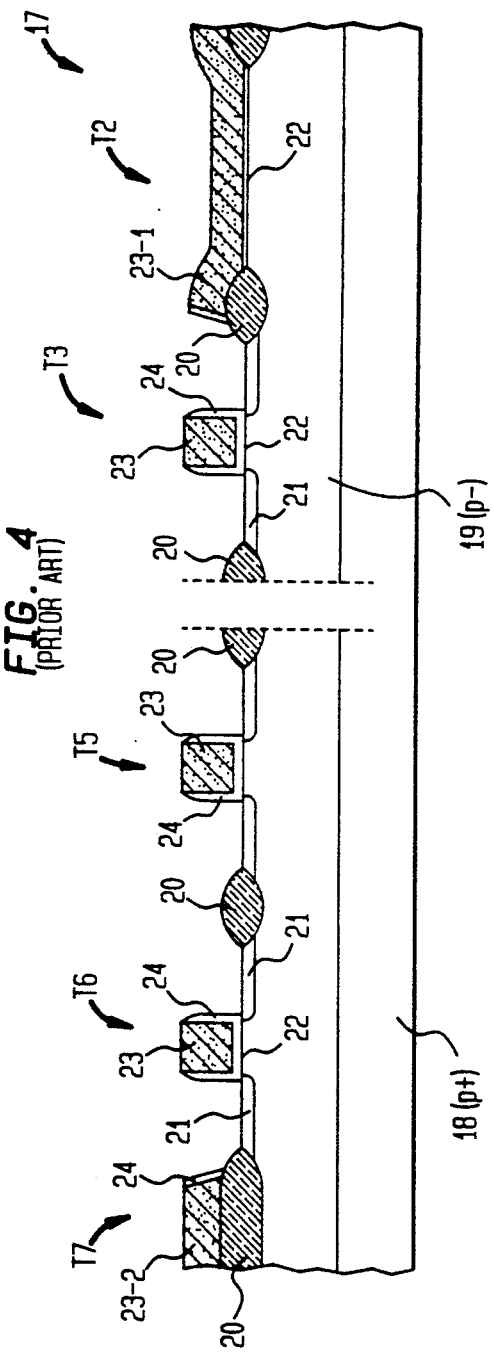
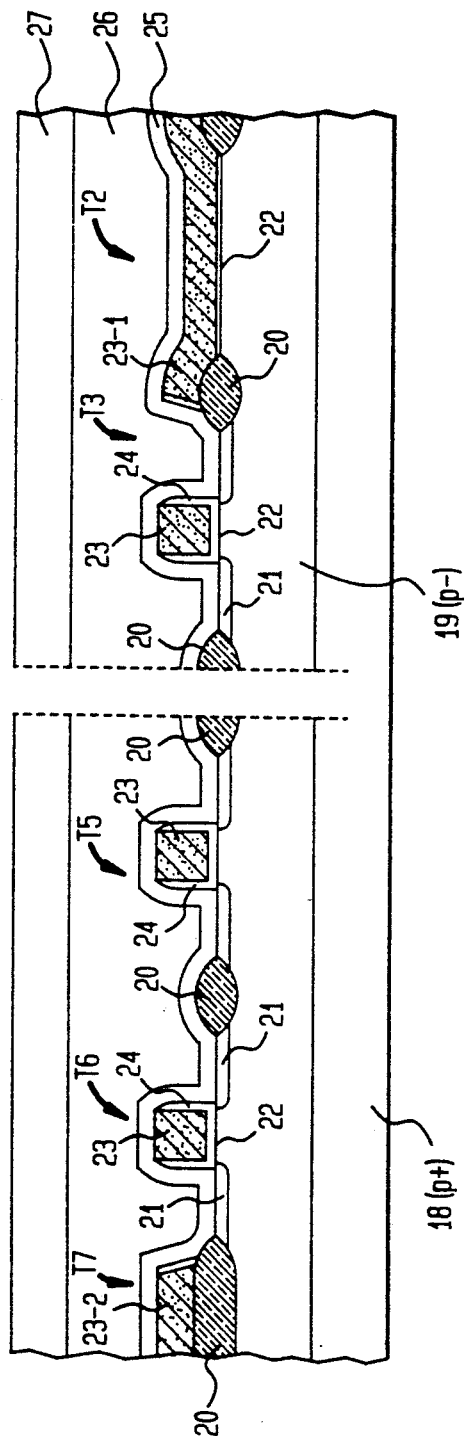

FIG. 11

METHOD OF FORMING STACKED CONDUCTIVE AND/OR RESISTIVE POLYSILICON LANDS IN MULTILEVEL SEMICONDUCTOR CHIPS AND STRUCTURES RESULTING THEREFROM

FIELD OF THE INVENTION

The present invention relates to Integrated Circuit manufacturing and more specifically to a method of forming stacked conductive and/or resistive polysilicon lands in multilevel semiconductor chips and to the structures resulting therefrom. In particular, the method has applicability in the forming of stacked polysilicon load resistors and/or overpass conductors for four device SRAM cells with resistive loads.

BACKGROUND OF THE INVENTION

Polycrystalline silicon (polysilicon) resistors are commonly used as load devices in a variety of digital and analog applications. Popular digital applications include semiconductor memory circuits such as Static Random Access Memories (SRAMs). FIG. 1 shows a conventional four device SRAM cell circuit referenced 1 with polysilicon load resistors. Two cross-coupled FETs T1 and T2, so-called the driver transistors, are connected between common node 2 tied to a first supply voltage Vs (usually the ground Gnd) and respective nodes 3 and 4, so-called charge storage nodes. These nodes 3 and 4 are connected to a common node 5 tied to a second supply voltage (usually a positive voltage Vc) respectively through load resistors R1 and R2. On the other hand, nodes 3 and 4 are also respectively connected to the bit lines BLT and BLC through FETs T3 and T4, so-called the access transistors. All FETs T1 to T4 are of the N type for best performance. The gates of the access transistors are connected to the word line WL, the potential of which controls FETs T3 and T4 for READ and WRITE operations. The circuit of FIG. 1 will be hereinafter referred to as the 4D/2R SRAM cell.

The flexibility that is offered by polysilicon load resistors in the design of the 4D/2R SRAM chip layout allows a significant reduction in the cell size, which in turn, results in a greater integration density It is now a general practice in the industry to have the load resistors of 4D/2R SRAM cells formed by resistive polysilicon lands obtained from a very thin layer of either intrinsic or low doped polysilicon material. In addition, the polysilicon load resistors are stacked above the FETs for further increased integration density according to the advanced state of the art known to date. However, because these polysilicon load resistors must be fairly high-valued, say in the tera-ohms ($10^{12}\Omega$) range, in order to decrease the current drawn by the cell, chip capacity appears to be limited to 1 megabits. Beyond 1 megabits, the polysilicon layer must be so thin that the process tolerances would be too difficult to control, consequently PFETs have to be used as load devices, but this is at the cost of a significantly more complicated manufacturing process.

FIG. 2 of the present application shows partial cross-sectional view of a typical structure of the prior art referenced 6, integrating the 4D/2R SRAM cell circuit of FIG. 1 with stacked polysilicon load resistors. Reference numeral 7 indicates the P type silicon substrate. Numerals 8 indicate the different field recess oxide (ROX) regions that are used to isolate the different active regions of the structure. Numerals 9 are active N+ implanted source and drain regions of the FETs. Numerals 10 indicate the gate dielectric layer, typically an $SiO_2$ layer. The highly doped polysilicon gate electrodes of access FET T3 and driver FET T2 are respectively referenced 11-1 and 11-2. A polysilicon conductor referenced 11-3 is represented for sake of illustration. Conductor 11-3 overlies a ROX region 8 and makes an electrical contact with the source region 9 of FET T3. Gate electrodes 11-1 and 11-2 and conductor 11-3 result from the patterning of a first highly doped polysilicon layer 11 and they are covered by a thin insulating protective layer 12, except a small portion of gate electrode 11-2 which remains exposed. A small polycide (polysilicon converted in polysilicon silicide) land 13-1 is used to make a low resistivity interconnection between gate electrode 11-2, N+drain region 9 of FET T3, and one end of load resistor R1 formed by a highly resistive polysilicon land 14-1. Polysilicon land 14-1 is obtained after patterning a second polysilicon layer 14 of either intrinsic or low doped polysilicon material. Polycide land 13-1 is exemplative of the local interconnect scheme at an early mask level that is conventionally used to provide short connections: e.g. from one active region of a FET to the polysilicon gate electrode of another FET or strap connections between two adjacent active regions separated by a ROX region. Alternatively, conductor 11-3 could be made of polycide instead of highly doped polysilicon as well. The resistive polysilicon land 14-1 is protected by top insulating layer 15. This top insulating layer 15 is relatively thick, say about 500–1000 nm and is generally made of phosphosilicate glass (PSG). As such, the structure results from the FEOL (Front End Of the Line) processing. At this stage of the process, the silicon wafer may be stored before personalization. Elements that will now be described are formed during the personalization steps or BEOL (Back End Of the Line) processing. Layer 15 is provided with contact openings to allow appropriate contacting with the bit lines, and power busses connected to either Vc or Gnd, through metal contacts that correspond to the M1 mask level. As apparent from FIG. 2, the other end of resistor R1 is connected to the said second supply voltage Vc via metal contact 16-1. Conductor 11-3 is connected to bit line BLT via metal contact 16-2.

FIG. 3 shows a cross-section of the structure of FIG. 2 taken along line I—I. FIG. 3 reveals in particular the implementation of driver FET T1 whose polysilicon gate electrode is referenced 11-4. Polysilicon land 14-2 forming load resistor R2 is located atop of it, but isolated therefrom by protective layer 12. Numeral 13-2 is another polycide land making a low resistivity interconnection between two active regions 9 separated by a ROX region 8.

Structure 6 depicted in FIGS. 2 and 3, that is obtained through a standard CMOS manufacturing process, exhibits some major inconveniences, mainly because the resistive polysilicon lands are formed during the FEOL processing steps. As apparent from FIGS. 2 and 3, all the succeeding layers are deposited conformally which results in the typical "corrugated" relief aspect of the upper metal/insulator structure. In particular, polysilicon load resistors (e.g. R1) formed by a polysilicon land (e.g. 14-1) have a very irregular shape. The top insulating layer 15 could be planarized as taught in "An advanced SA BICMOS technology for high performance 1 Mbits ECL I/0 SRAMs" by W. R. Burger et al., IEEE proceedings IEDMP, p. 16.3.1 to 16.3.5, see in particular FIG. 1. However, this would necessitate a step of reflow at a relatively high temperature (about 800°–900° C.), that would change both the dopant distribution in the resistive polysilicon lands (e.g. 14-1) and polysilicon grain size thereof, which in turn, would modify value of the resistors (e.g. R1). It is a major characteristic of the structures of the prior art, to have the resistive polysilicon lands formed upon non-planar surfaces and before the PSG deposition takes place. In other words, the resistive polysilicon lands are fabricated during the FEOL processing steps.

In addition, should the photolithographic step that is used to delineate the resistive polysilicon lands, e.g. land 14-2 atop the gate electrode 11-4 of FET T1, be subject to misalignment, this in turn, would result in a misregistration between land 14-2 and gate electrode 11-4. This point is illustrated in FIG. 3, where the offset of land 14-2 in land 14-2', as a result of said misregistration, is shown. As a consequence, the offset polysilicon land 14-2' is not only subject to the well known "step or edge coverage" effect which may result in a break of the land, but also to a significant change in the land section, thereby preventing load resistor R2 from attaining a value that is necessary for an appropriate operation of the circuit of FIG. 1. In addition, misregistration also results in poor reproducibility from chip to chip.

Another important point is the trimming of the resistive polysilicon lands during the wafer processing. This step is usually completed in CMOS standard processes by implanting dopants to trim the resistivity of the resistive polysilicon lands at the high resistance value that is desired and to ensure that a good matching between the pair of resistors of a same cell is obtained. With structure 6 of FIG. 2, this objective is difficult to attain because both polysilicon layer 14 and protective layer 12 are very thin, e.g. about 50–100 nm. Layer 14 must be thin to permit achievement of high value resistors, and layer 12 has to be thin enough not to create additional undesired relief in the upper metal/insulator structure. As a result, the implant energy must be accurately controlled. Otherwise, implantation dopants will contaminate underlying FETs. In addition, thinness of protective layer 12 creates a problem of modulation of the value of the resistor (e.g. R2) by the underlying polysilicon gate electrode (e.g. 11-4).

Finally, as explained above, the structure of FIGS. 2 and 3 capitalizes on the local interconnect conductive pattern scheme formed at an early mask level. It is well known that this pattern is limited to very short distance connections and at the vicinity of the surface of the silicon wafer. This limitation causes a serious problem to the circuit designer, particularly in multilevel chips. It is also apparent from FIG. 2 that the fragile polycide land 13-1 is also subject to the above mentioned "edge coverage" effect due to the sidewall sharpness of polysilicon gate electrode 11-2. Moreover, formation of polycide lands 13-1 and 13-2 also necessitates a specific photolithographic step.

As a result, for all the above mentioned reasons, the reliability of semiconductor structures integrating the 4D/2R SRAM cells manufactured according to standard CMOS processes as well as the inherent limitations thereof are not satisfactory in many respects.

OBJECTS OF THE INVENTION

It is therefore a primary object of the present invention to provide a method of forming stacked conductive and/or resistive polysilicon lands that obviates all the inconveniences mentioned above, fundamentally because said lands are formed during the BEOL (personalization) steps and on a planar surface.

It is another object of the present invention to provide method of forming reliable and reproducible resistive polysilicon lands in multilevel semiconductor chips that can be used as load resistors typically in 4D/2R SRAM cells.

It is another object of the present invention to provide a method of forming conductive and/or resistive polysilicon lands that is not subject to the problems caused by photolithographic misalignment.

It is another object of the present invention to provide a method of forming resistive polysilicon lands, whose resistivity can be adjusted through an ion implantation step without disturbing devices underneath and with minimum tolerance control constraints.

It is still another object of the present invention to provide method of forming conductive polysilicon lands in multilevel chips that can be used at any level as conductors.

SUMMARY OF THE INVENTION

These objects and others are achieved according to the present invention by a method of forming conductive and/or resistive polysilicon lands on a conventional base semiconductor IC structure after completion of the Master Slice steps and the structures resulting therefrom. Said conventional base structure has active regions forming bipolar devices, FET devices or a mix thereof and/or polysilicon lines formed therein. According to the method of the present invention said base structure is further submitted to the following step sequence:

a) depositing a first thick passivating layer of a dielectric material that can be planarized onto said base structure;

b) forming a set of first stud openings in said first thick passivating layer exposing at least one of said active regions and/or said polysilicon lines;

c) depositing a first layer of a conductive material to fill said first stud openings and define a set of first contact studs;

d) planarizing the structure to make the top surface of said first contact studs coplanar with the surface of said first thick passivating layer;

e) depositing a layer of high resistivity polysilicon over the planarized structure;

f) patterning said polysilicon layer to define a plurality of resistive polysilicon lands contacting where desired said first contact studs;

g) depositing a second thick passivating layer of a dielectric material that can be planarized onto the structure;

h) forming a set of second stud openings in said second thick passivating layer to expose desired portions of said polysilicon lands and/or first contact studs;

i) depositing a second layer of a conductive material to fill said second stud openings and define a set of second contact studs;

j) planarizing the structure to make the top surface of said second contact studs coplanar with the surface of said second thick passivating layer.

The method may further include before step g), the step of making highly conductive certain of said resistive polysilicon lands or portions thereof, should conductors be required along with resistors in the final structure. The above steps e) to j) may be repeated several times in the fabrication of a multilevel semiconductor chip.

In essence, according to a preferred embodiment, the method of the present invention aims at the forming of resistive and/or conductive polysilicon lands over a thick planarized passivating layer, the latest possible in the course of the manufacturing process, typically during the BEOL processing steps. As a result, in the final structure, said polysilicon lands can be used either as resistors or conductors depending on their resistivity. Resistors that are formed with the present method are not subject to misalignment and adverse modulation, they also exhibit excellent reproducibility. On the other hand, conductors that are formed according to the present method can be used not only as a substitute to an early level local interconnect scheme for short distance and straps connections at the wafer level, but also participate to the interconnection scheme at the different levels of a multilevel semiconductor chip. Mix resistive/conductive polysilicon lands can also be used at any level to further facilitate the wiring of the resistors.

The novel features believed to be characteristic of this invention are set forth in the appended claims. The invention itself, however, as well as other objects and advantages thereof, may best be understood by reference to the following detailed description of an illustrated preferred embodiment to be read in conjunction with the accompanying drawings.

In the drawings:

FIG. 1 is a diagram showing a conventional 4D/2R SRAM cell circuit implemented with four FET devices and two polysilicon load resistors.

FIG. 2 is a cross-sectional view partially broken away of a known structure integrating the 4D/2R SRAM cell circuit of FIG. 1 in a silicon substrate according to a conventional polysilicon gate CMOS FET manufacturing process.

FIG. 3 is cross-sectional view taken along line I-I of the structure of FIG. 2.

FIG. 4 shows a partial cross-sectional view of a conventional base structure after source/drain region formation in a standard polysilicon gate CMOS FET manufacturing process.

FIGS. 5 to 10 show the base structure of FIG. 4 being processed through a sequence of processing steps in accordance with a preferred embodiment of the method of the present invention.

FIG. 11 shows a cross-sectional view of another portion of the structure of FIG. 10.

Figure 6:
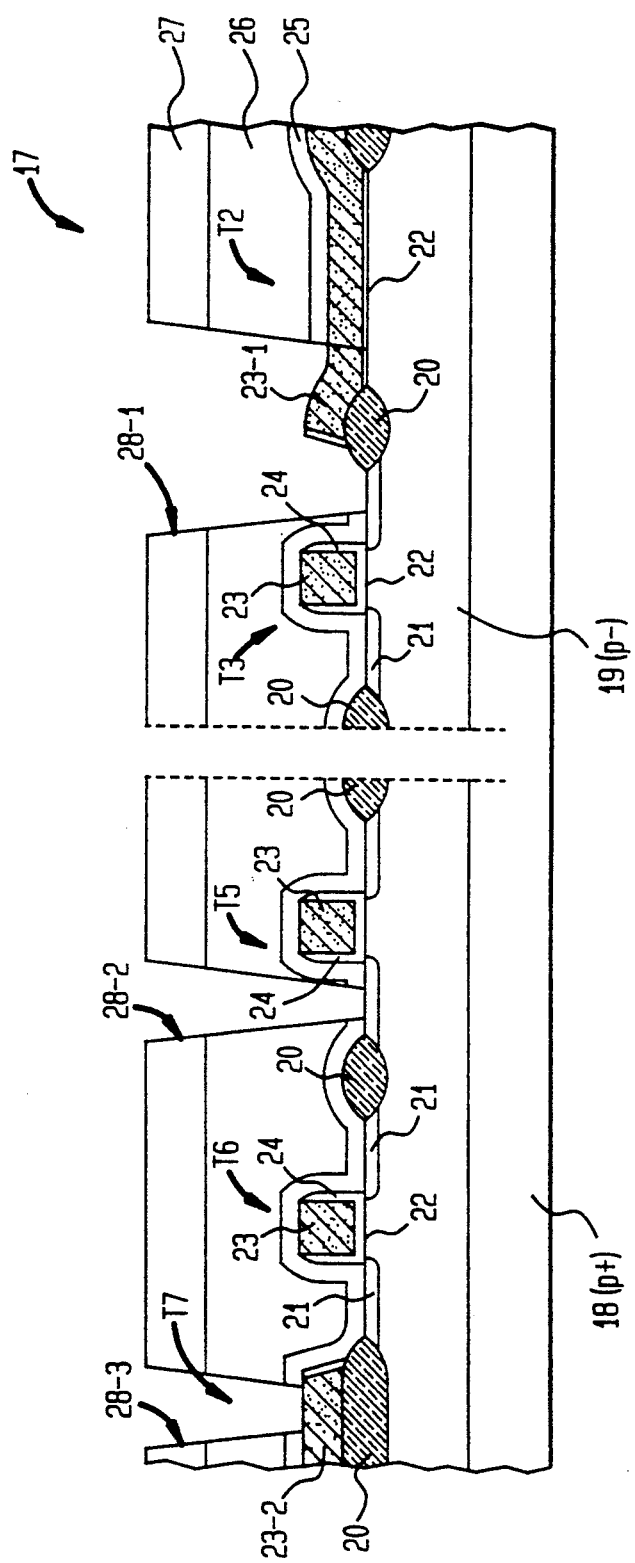

FIG. 4 shows a conventional base structure of the prior ar after source/drain region and polysilicon gate electrode formation that results from a standard polysilicon gate CMOS FET process. The right hand part shows the driver FET T2/access FET T3 combination of the 4D/2R SRAM cell circuit of FIG. 1 and is similar in some respect to the structure shown in FIG. 2. The left hand part shows three adjacent FETs referenced T5, T6 and T7, such as those that can be found in the I/0 circuit portion of the chip, outside the memory array properly said. The whole structure is designated by reference 17 and will now be briefly described. The starting material consists of a standard P+ silicon substrate 18 having a P− epitaxial layer 19 thereon. ROX regions 20 are used as it is well known for the skilled man to isolate active regions one from the others at the surface of the wafer. N+ implanted active regions 21 have been formed in the epitaxial layer 19 to constitute the source and drain regions of the FETs. Regions 21 are generally provided with a thin $TiSi_2$ contact layer to reduce their sheet resistance thereby improving the electrical contact quality with the contact studs to be formed subsequently. The gate dielectric layer, typically an $SiO_2$ layer, is referenced 22. Numerals 23 generically indicate the remaining portions of the N+ highly doped polysilicon layer 23 that has been patterned to create the polysilicon gate electrodes. More specifically, numerals 23-1 and 23-2 designate respectively the gate electrodes of FETs T2 and T7. Oxide sidewalls or spacers 24 have been formed on the lateral sides of the polysilicon gate electrodes for a better definition of the channel length of the FETs. The above-described base structure of FIG. 4 shown for the purpose of illustrating the present invention is amenable to fabrication by the use of many known semiconductor manufacturing processes, but is not limited to CMOS technology. Firstly, the said remaining polysilicon portions are not limited to gate electrodes, they could be lands used as conductors, as such forming the extrinsic base contact in a polysilicon self-aligned bipolar transistor manufacturing process. Consequently, said remaining polysilicon portions 23 will be referred to more generally as polysilicon lines. Secondly, active regions 21 are not limited to source and drain regions of FETs but also include emitter, base and collector regions of bipolar devices. To take into account that structure of FIG. 4 could be adapted to result either from a bipolar, CMOS or BiCMOS manufacturing process, any base structure at the stage of FIG. 4, is said to have completed the Master Slice processing steps. In other words, this means that the forming of active regions 21 (irrespective the type of devices formed therein) and optionally polysilicon lines 23-1, . . . , has been accomplished.

DETAILED DESCRIPTION OF A PREFERRED EMBODIMENT OF THE METHOD OF THE PRESENT INVENTION

Now a preferred embodiment of the method of the present invention will be described with reference to FIGS. 5 to 10.

1) First, in FIG. 5, a relatively thick layer of a passivation and planarization dielectric material is deposited onto the conventional base structure of FIG. 4. To that end, the wafer is cleaned by dipping in a tank containing an $H_2SO_4/H_2O_2$ (4:1) acidic solution. This cleaning step will be referred to below as the Piranha clean. Preferably, a thin $Si_3N_4$ diffusion barrier layer (not shown) is blanket deposited over the wafer with a thickness of 50 nm. The $Si_3N_4$ diffusion barrier layer avoids potential dissolution of the $TiSi_2$ contact layer in the upper layers to be subsequently formed. This step is completed in a standard LPCVD equipment at 785° C. with a $SiH_2Cl_2/NH_3$ atmosphere. An intrinsic polysilicon etch stop layer 25 is conformally deposited over the surface of the wafer using conventional CVD process to a thickness in the range of 50 nm. The etch stop layer is used to protect the bird's beak of the ROX regions should a contact stud overlying both silicon (e.g. at a source/drain region) and $SiO_2$, (e.g. at a ROX region) be required. The material forming this etch stop layer must have a good etching selectivity with the phosphosilicate glass (PSG) layer to be subsequently formed.

$Al_2O_3$ is suitable but intrinsic polysilicon is preferred, because it has not only the desirable high etch ratio with PSG, say about 25:1, but it is easier to etch. The structure is cleaned again in two steps: first, using the Piranha clean as described above followed by a Huang B clean in an $H_2O/HCl/H_2O_2$ (5:1:1) acidic solution, then rinsed. The PSG layer 26 is now deposited conformally at 400° C., using a $SiH_4/PH3$ gas with $N_2$ as the carrier in a APCVD reactor such as a WATKINS-JOHNSON to reach a thickness of 900 nm. Optionally, a 200 nm thick intermediate pyrolitic $SiO_2$ layer (not shown) can be introduced between intrinsic polysilicon layer 25 and PSG layer 26. It aims to protect the intrinsic polysilicon from being doped by the phosphorous dopants contained in the PSG layer 26. The deposition is achieved in an AME-5000 equipment at 440° C. in an $O_2/SiH_4/N_2$ ambient. Next, the PSG layer 26 is chem-mech polished for fine planarization in a WESTECH or STRAUSBAUGH equipment using a solution of colloidal $SiO_2$ in water, e.g. the slurry reference SC1 sold by SPEAR CARBO. After polishing, the remaining thickness is 600 nm. This step is followed by a post-clean in a SVG double-sided brush cleaner.

After a new two-step cleaning as mentioned above, the process continues with the deposition of a PECVD $SiO2$ layer 27. The purpose of this layer is to act as a diffusion barrier layer in blocking the outdiffusion of the phosphorous dopants contained in the PSG layer into the upper layer of polysilicon to be subsequently formed. This step is completed in a standard PECVD equipment such as an AME-5000. The desired thickness of layer 27 is about 200 nm. Should a non contaminating passivating and planarizing dielectric material be used, e.g. quartz, the need of layer 27 could be eliminated. Quartz is appropriate, but results in an expensive process. Organic materials, such as polyimide, are also appropriate but behave badly in hot processing steps. Finally, phosphosilicate glass (PSG) is the preferred material although it necessitates an etch stop layer and at least two diffusion barrier layers. The wafer is then annealed in a furnace at 750° C. during 1H in an $N_2$ ambient. The resulting structure is shown in FIG. 5. This terminates the list of elements formed during the FEOL processing steps.

2) At this point of the process, the step of forming the set of first stud openings is now completed, as provided in FIG. 6. After a new two-step cleaning, a photoresist adhesion promoter such as HMDS is applied onto the structure (prebake time 7 mn), then a standard photoresist, e.g. the e-MERCK resin is applied e.g. in a MTI MULTIFAB equipment, and baked. After alignment, the resist is exposed to UV light through a mask in a NIKON G6 stepper and developed to produce an in-situ resist mask (not shown) having the desired configuration. First stud openings generically referenced 28 are formed by etching first the PECVD diffusion barrier layer 27 then, the thick PSG planarized layer 26 (and the optional pyrolitic $SiO_2$ layer mentioned above if any), downwards to the etch stop layer 25. This step of etching can be completed in a AME 8300 using $CHF_3/O_2$ reactive gas. Finally, the exposed portions of the intrinsic polysilicon etch stop layer 25 are etched in the same equipment using either a $Cl_2/O_2/Ar$ or $HCl/O_2/Ar$ plasma. The resist is stripped off and the structure cleaned again. Next, the structure is annealed in an ammonia ($NH_3$) ambient in a THERMCO equipment at 700° C. during 55 mn with $N_2$ as the carrier gas. The intrinsic polysilicon is oxidized through the thick dual passivating layer 26/27 to become fully neutral from an electrical stand point. This step is achieved in a THERMCO oxidation furnace model HiPOX at high pressure. Finally, the exposed portions of the underlying $Si_3N_4$ layer are etched in a $SF_6$ plasma in a TEGAL 901 ipment. The resulting structure provided with three first stud openings 28-1, 28-2 and 28-3 is shown in FIG. 6.

Figure 7:
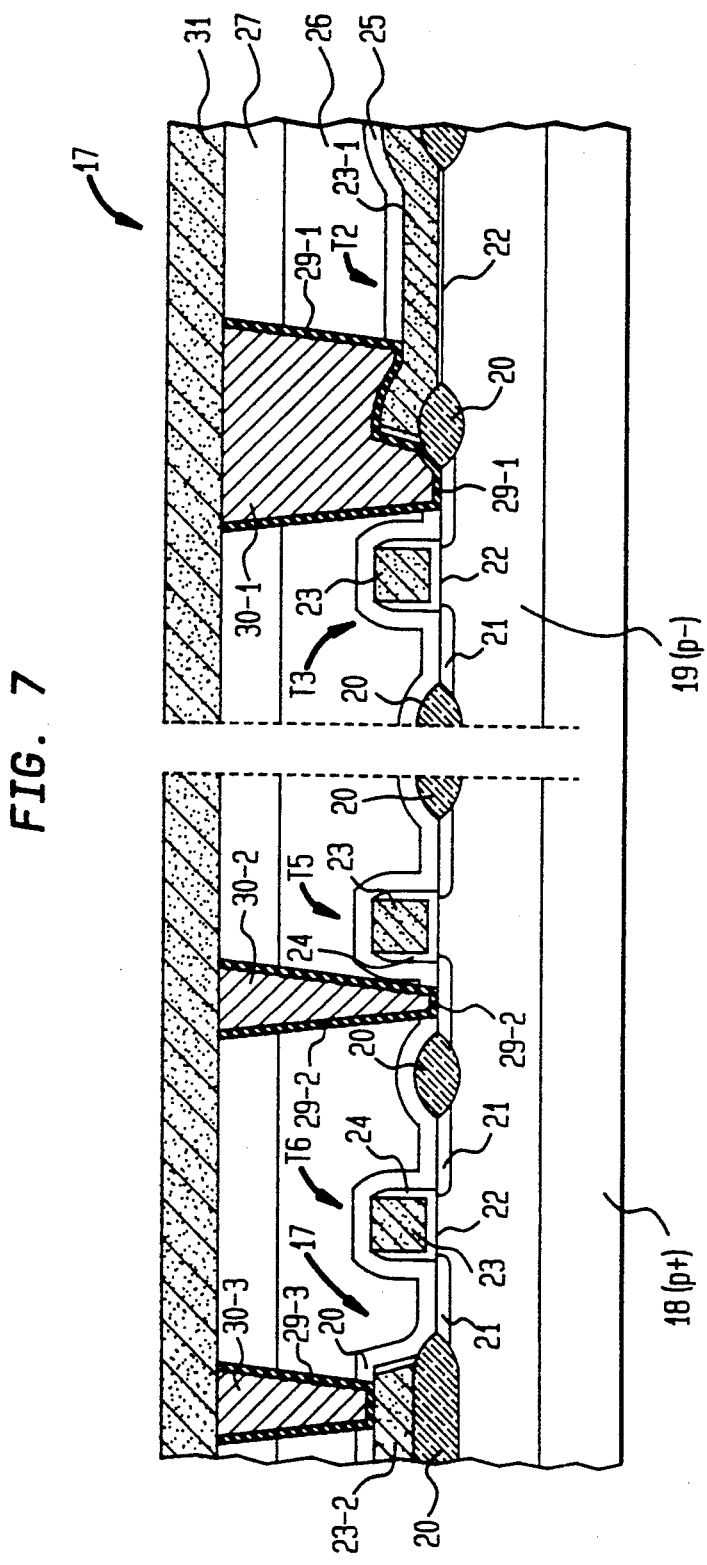

3) Now, turning to FIG. 7, the steps of filling the first stud openings with a highly conductive material, typically a metal such as tungsten, and planarization are completed. To that end, the structure of FIG. 6 is first cleaned in a 100:1 diluted HF solution and rinsed. Prior to tungsten (W) filling, a titanium (Ti) layer is deposited with a thickness of about 40 nm in a VARIAN equipment to plate the bottom and side-walls of first stud openings. This titanium layer prevents the diffusion of tungsten atoms in the active regions 21. Next, a thin titanium nitride (TiN) layer is formed over the titanium layer. This TiN layer aims to improve adhesion of the tungsten layer. This step is accomplished in the same VARIAN M2000 equipment, but a flow of $N_2$ is added to the carrier gas Ar until a layer thickness of 25 nm is obtained. A tungsten layer is then deposited in two steps to entirely fill the first stud openings. A CVD GENUS equipment is appropriate in that respect. Firstly, deposition is carried out at a high rate of 120 nm/min. at 450° C. using a $SiH_4/WF_6/H_2/He$ gas combination until a thickness of 240 nm is attained. Then, the deposition is continued at a lower rate of 40 nm/min. in the same equipment and with the same operating conditions, except in that, $SiH_4$ is no longer used, until the desired final thickness of about 550 nm is obtained. The metal layers are now planarized using either a chem-mech technique, as described in EP-A-0223920 entitled: "Chem-mech polishing method for producing co-planar metal/insulator films on a substrate" assigned to the assignee of the present invention, or by plasma etching in an AME 8100 using a $BCl_3/Cl_2/N_2$ gas. This step is followed by a post-clean in a SVG double-sided brush cleaner. Planarization of the Ti-TiN and W composite layer forms first contact pads 29 and first contact studs 30 in first stud openings 28 that are referenced with corresponding references. As apparent from FIG. 7, the top surface of the first contact studs 30 is now coplanar with the surface of the PECVD oxide layer 27.

Next, a CVD intrinsic or lightly-doped polysilicon layer 31 is deposited in a LPCVD equipment such as an ASM or TEMPRESS, at 615° C. using $SiH_4$ to reach at thickness of 100 nm. If layer 31 is made of intrinsic polysilicon, it must be highly doped for better resistivity control. To that end, P type (boron) or N type (Phosphorous) dopant are blanket implanted in layer 31, thereby adjusting the value of load resistors. This step is followed by a standard anneal in a furnace during 30 min at a temperature in the range of 600°-800° C. It must be noticed that the anneal temperature necessary to reactivate the dopants has to be maintained as low as possible to avoid any problems for the devices (typically FETs) underneath. This implantation step can be effected with less control than with the structure of FIG. 2 because of the PSG layer 25 is very thick. As a result, there is substantially no risk to disturb said devices underneath. Polysilicon layer 31 will provide the resistive land after patterning that are desired to build the load resistors. However, as it will be explained later, some of these resistive lands will be rendered conductive either by heavy ion implantation doping or preferably by silicidation, to be used as conductors. At this stage of the process, the resulting structure is shown in FIG. 7.

Figure 8:
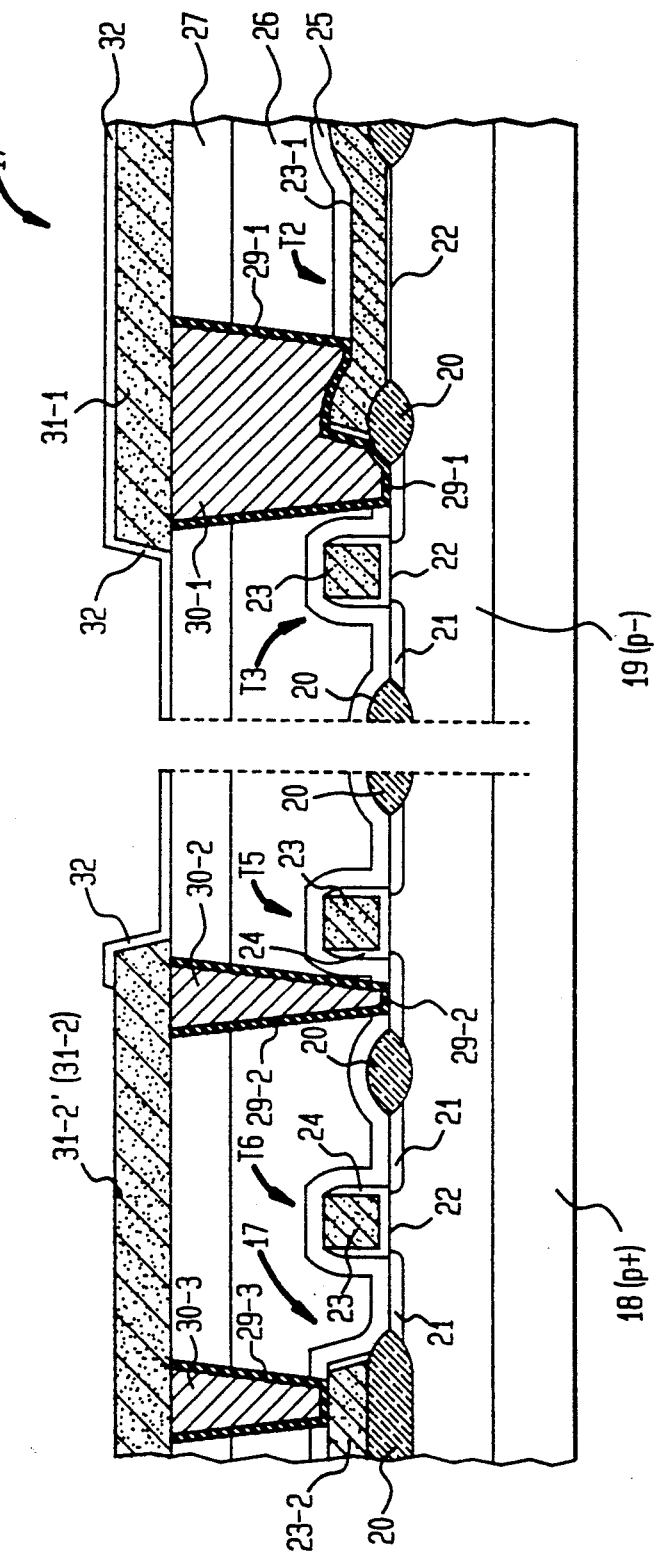

4) A photo lithographic step is then performed, similar to the one previously mentioned in above point 2) to delineate the appropriate in-situ resist mask (not shown) that will be used to create the desired resistive polysilicon land configuration in FIG. 8. Tot his end, the structure is submitted to RIE in a TEGAL 1500 using a standard reactive gas composition such as $CF_4/O_2/Cl_2/HCl$ that has a high polysilicon /PECVD $SiO_2$ etch-rate ratio. It may be noticed that all contacts are made directly, via the contact studs, without adding any specific contact mask. In addition, misregistration is no longer a problem. As a result, the "edge coverage" effect mentioned above, that is potentially detrimental to the reliability of the polysilicon resistors of the prior art, is avoided because the resistive polysilicon lands being now formed onto a planar surface, misregistration is no longer a sensitive parameter of the process. Finally, a cap TEOS oxide layer 32 with a thickness of about 100 nm is deposited in a PECVD equipment such as an AME-5000. Note that the implantation step for resistivity control can be performed after polysilicon land patterning as well. In this case, layer 32 plays the role of a screen layer.

A new in-situ resist mask (not shown) is formed over the structure and the cap oxide layer 32 is opened on the portions of the polysilicon lands to be used as conductors of an interconnection pattern. Silicidation is the preferred way to make conductive the highly resistive polysilicon lands. The polysilicon silicidation step comprises deposition of a titanium layer (not shown) of about 100 nm either by sputtering or evaporation e.g. in a VARIAN or BALZERS equipment. The titanium is sintered in an ASM equipment to form a titanium di-silicide alloy ($TiSi_2$) in exposed areas of selected polysilicon lands. Operating conditions comprise a temperature of 700° C., during 20 min in a N2 ambient. Alternatively, sintering could be achieved by a rapid thermal anneal (RTA) during 20 sec at 800° C. Unreacted titanium is selectively removed by a wet etch: e.g. in a $H_2O_2/H_2SO_4$ acid solution. Finally, the structure is cleaned in a Huang A solution: $H_2/NH_4OH/H_2O_2$ (5:1:1) then annealed at 700° in an ASM equipment during 20min under a N2 atmosphere. The exposed portions that are silicided provide the low resistivity material, say polycide, to form the conductive lands 31-2' that will used as conductors. In FIG. 8, there is shown a strap comprised of overpass conductor 31-2' and contact studs 30-2 and 30-3 that can replace the use of polycide lands of the local interconnect scheme produced at an earlier mask level. As a result, according to the present invention, contact stud 30-1 of FIG. 8, avoids the need of polycide land 13-1 of FIG. 2 and failures attached thereto. However, the invention is not limited to that particular aspect of providing short distance and strap connections, as it will be explained later. At this stage of the process, both resistive lands (e.g. 31-1 to be used as resistors) and conductive lands (e.g. 31-2' to be used as conductors, in particular, overpass conductors) have been formed.

Figure 9:
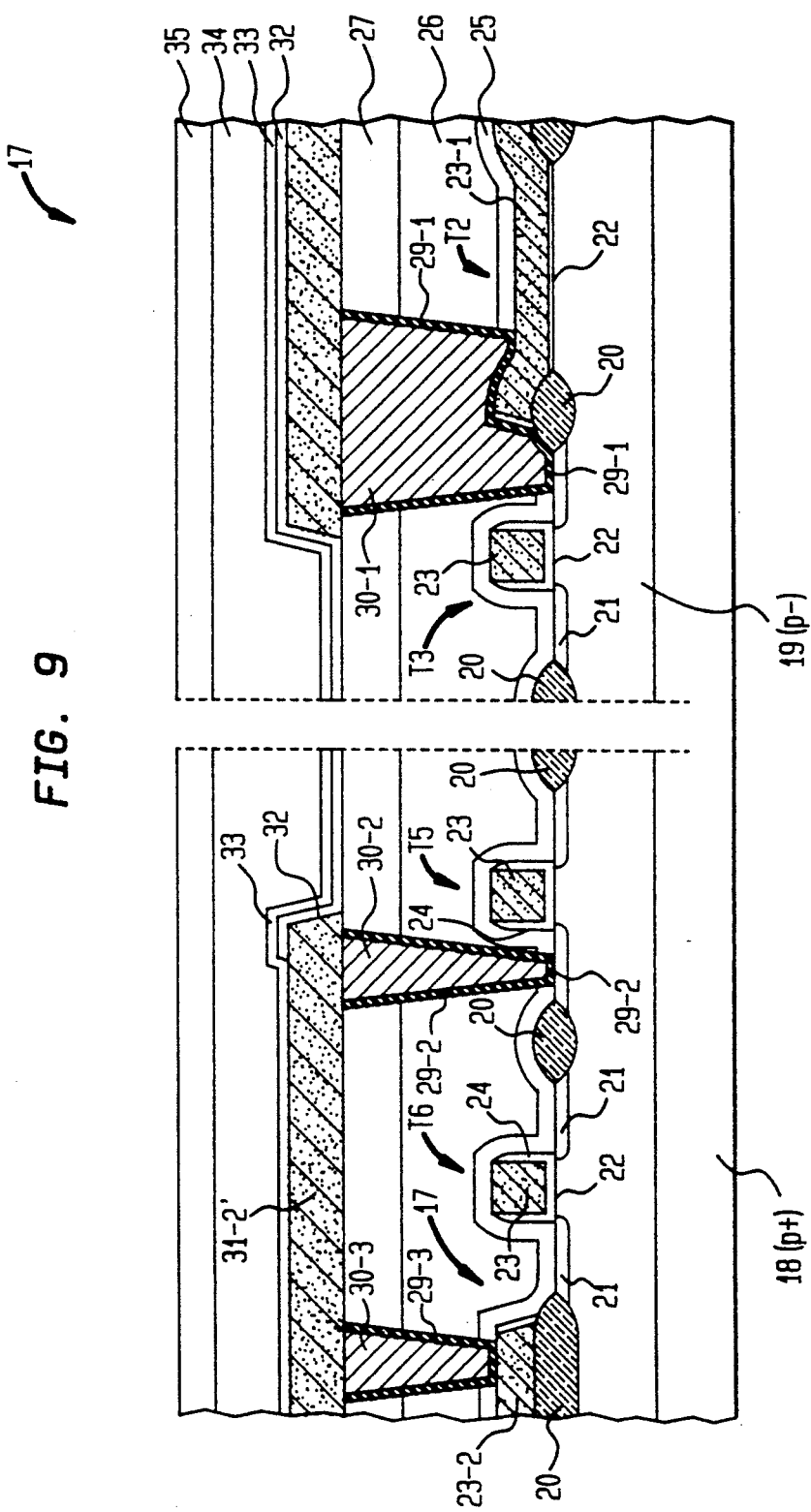

5) Another cap TEOS oxide layer 33 is deposited in FIG. 1 to encapsulate the structure and to prevent Ti diffusion from the polycide conductive lands into the PSG layer to be subsequently formed. After full cleaning and rinsing, a new PSG layer 34 is deposited and planarized in same conditions as stated above with respect to point 1). The structure is then annealed in a furnace at 750° C. in a N2 ambient during 60 min. Next, a PECVD oxide or preferably a PSG thin layer 35 is deposited thereon, mainly in order to compensate for the surface roughness of the PSG layer 34 caused by the chem-mech step. Layer 35 does not act as a diffusion barrier layer as it was the case for layer 27, unless of course, a novel polysilicon layer is to be deposited again onto the surface of the structure in the fabrication of a multilevel semiconductor chip. The resulting structure is shown in FIG. 9.

Figure 10:
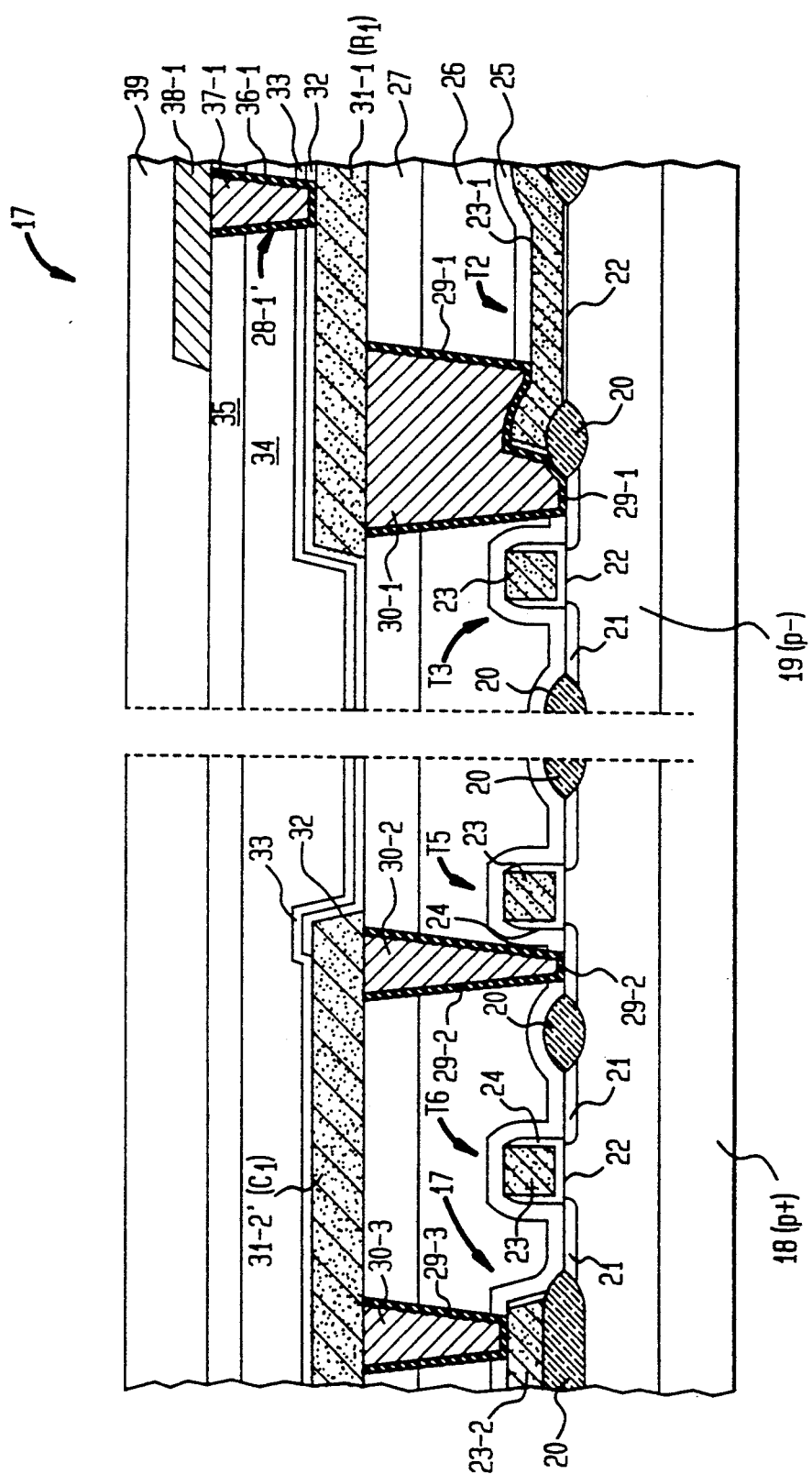

6) Now turning to FIG. 10, second stud openings generically referenced 28', are formed by etching the dual PSG layer 34/35, the material of the etch stop layer being either polycide (for a conductor), polysilicon (for a resistor) or tungsten (for a contact stud). The etching is carried out in an AME 8300 equipment with $CHF_3/O_2$ as the reactive gas through an in-situ resist mask (not shown) formed as explained above. Next, the resist mask is stripped off and the structure is cleaned and rinsed. The process continues with the deposition of a Ti layer, then a TiN layer, that are sequentially blanket sputtered on the whole wafer to plate the bottom and side-walls of said second stud openings. Second stud openings are then filled with a tungsten layer 37. Next, the structure is planarized again. All these steps are identical to those detailed above in point 3). The Ti-TiN and W composite layer forms second contact pads 36 and second contact studs 37 in second stud openings 28' that are referenced with corresponding references. In most cases, second contact studs aims to make contact to the resistive and/or conductive lands previously formed. A second contact stud referenced 37-1 is shown in FIG. 10. Standard first metallization layer 38 can be deposited and patterned according to the first metal mask level to leave metal lands e.g. 38-1 where desired to form interconnection conductors and power busses. The metallization layer may be an Ti/Al-Cu/Si metallurgy as standard. The final structure is shown in FIG. 10. Normal BEOL process can now continue. The structure is covered again by an insulating film 39 of PECVD oxide. With respect to metal lands 38-1, . . . , the first and second contact studs can be respectively understood as the first and second half-studs, since usually, contact studs make a direct contact between metal lands 38-1, . . . and active regions 21.

The steps of depositing the dual PSG layer 34/35, of forming second contact studs 37-1, . . . and metal lands 38-1, . . . could be repeated again should the chip be of the multilevel type. Note that a planarization step is associated to each stud level. The structure fabrication is terminated by completing the terminal metallurgy steps including forming the contact pads of the Ball Limiting Metallurgy (BLM) and contact terminals (e.g. solder balls) as widely described in the literature.

From the above process description, it can be noticed that the method of the present invention implies only two more masks when compared with a CMOS standard process not offering polysilicon load resistors in the menu. On the other hand, if conductive polysilicon lands are not necessary, just one more mask is needed to insert high resistivity polysilicon resistors in a standard CMOS process because the masking step for silicidation is no longer required.

OTHER CONSIDERATIONS

The disclosed method of the present invention allows replacement of the local interconnect scheme that is defined at an early mask level. As apparent from FIG. 10, some local interconnections, e.g. straps, previously made at an early mask level by polycide lands, are now made of two metal (tungsten) first contact studs (e.g. 30-2, 30-3) and one polycide overpass conductor (e.g. 31-2'). The connection of one end of resistor R1 (polysilicon land 31-1) to metal land 38-1 of the first metal mask level is made by second contact stud 37-1. Note that a second contact stud may be piled-up above a first contact stud for direct connection from a metal land 38- to an active region 21 or a polysilicon line, e.g. 23-1, at the wafer level.

Figure 11:
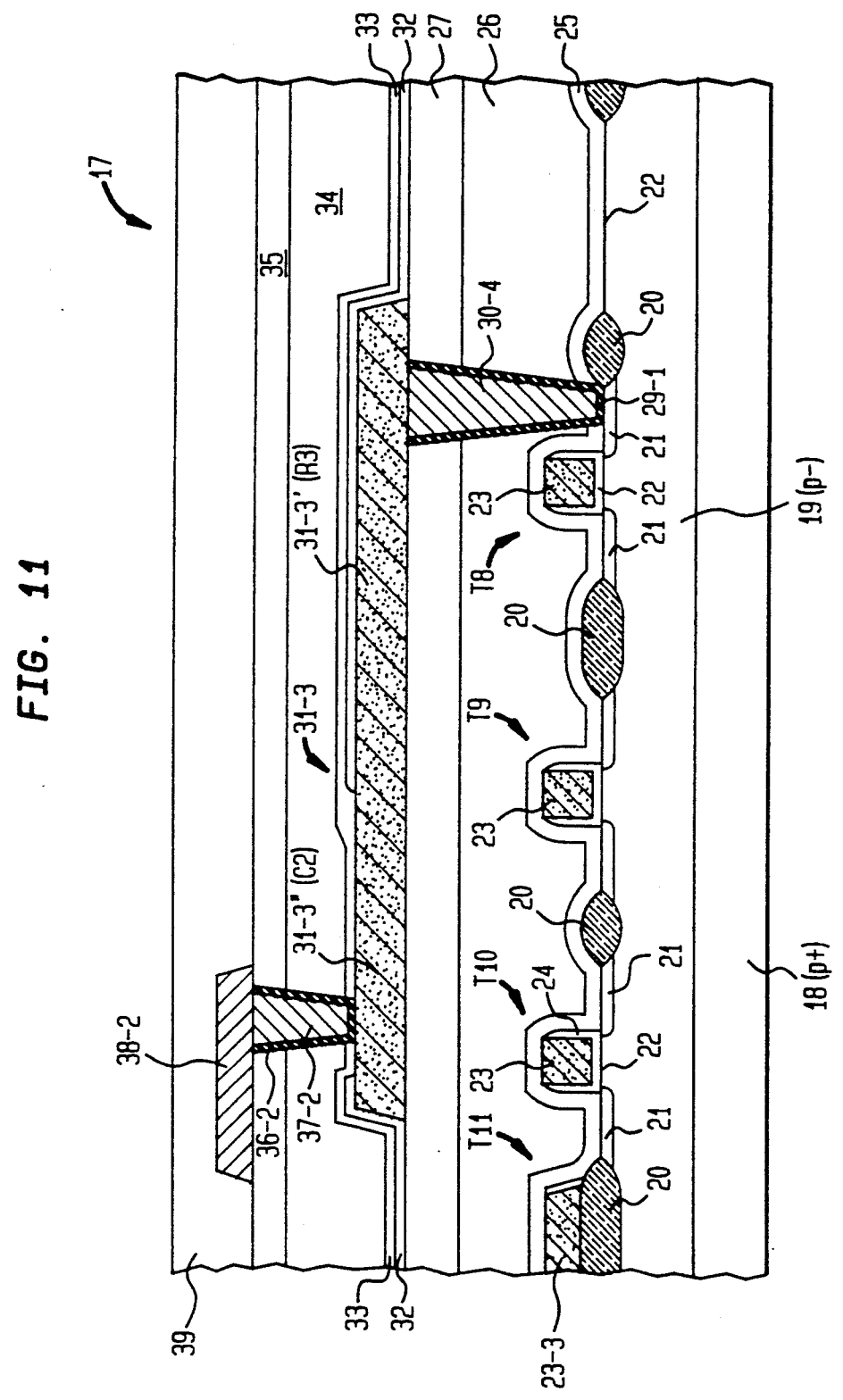

As apparent from the method of the present invention, it can be provided not only high resistivity polysilicon lands to be used as load resistors but also low resistivity polysilicon lands for interconnection conductors typically overpass conductors. This is an advantage which can be extensively used in particular in the peripheric portion of the chip, say in the I/0 circuits of the SRAM chip as well as in logic chips. This will be illustrated in conjunction with FIG. 11 which shows a cross-sectional view of another portion of the final structure of FIG. 10. FIG. 11 shows how a polysilicon land 31-3 may be of a mix resistor/conductor type. As a matter of fact, polysilicon land 31-3 combines both a resistive portion 31-3' and an conductive portion 31-3" to give further flexibility to the circuit designer, thereby facilitating the chip wiring. Resistive land 31-3' that forms resistor R3 is connected at one end to an active region of FET T8 via first contact stud 30-4. The other end of resistor R3 is merged with one end of conductive land 31-3" forming conductor C2. The other end of conductive land 31-3" is connected to the metal land 38-2 via second contact stud 37-2. Other implementations or combinations can be envisioned.

Figure 13:
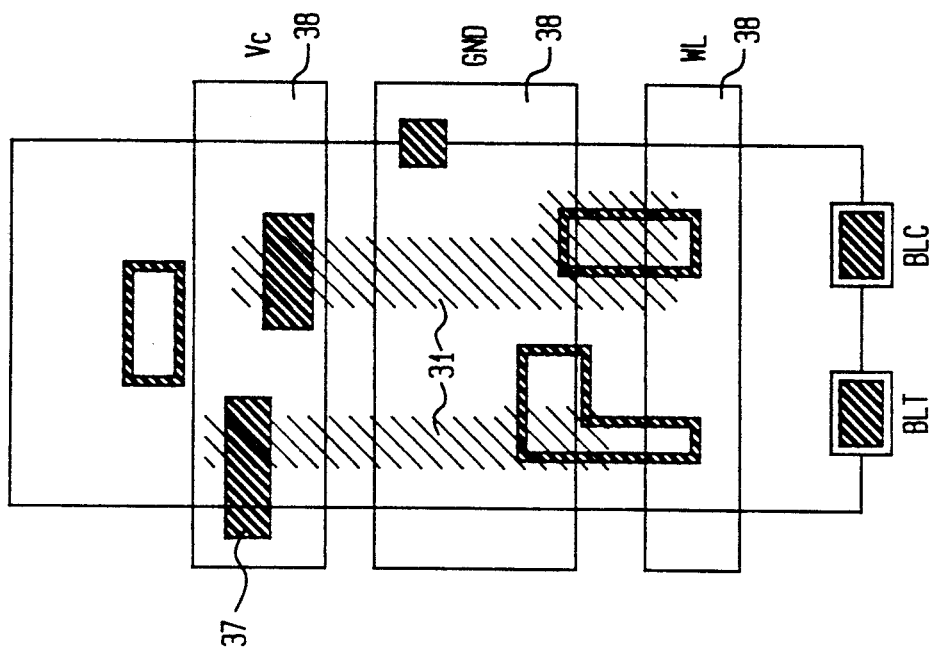
FIGS. 12 and 13 are plan views which show the typical lay-out of the 4D/2R SRAM cell of the present invention respectively at two different stages of the manufacturing process.
Figure 12:
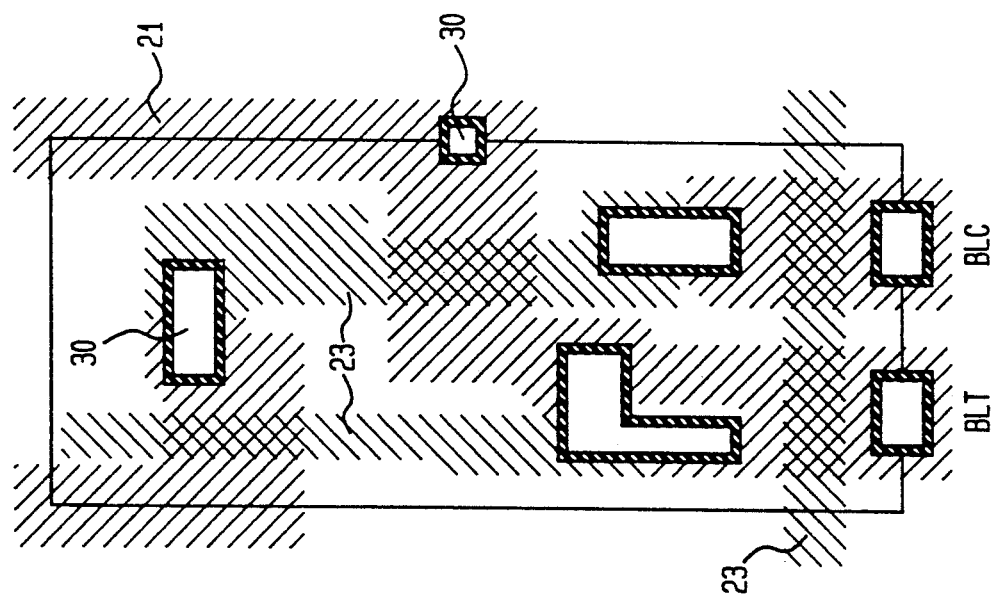

FIGS. 12 and 13 are typical views of the lay-out of the 4D/2R SRAM cell when manufactured according to the method of the present invention at different stages of the manufacturing.

FIG. 12 shows the lay-out of the structure at the stage of FIG. 7 just before deposition of polysilicon layer 31.

FIG. 13 shows the lay-out corresponding to the structure at the stage of FIG. 10 when the metal lands defining in particular the power busses (Vc, Gnd) and the word lines (WL) have been formed at the first metal mask level.

While the preferred embodiment of the present invention has been herein described, numerous modifications, changes and improvements will occur to those skilled in the art without departing from the spirit and scope of the present invention.

We claim:

1. In the manufacturing of a multilevel semiconductor chip a method of forming polysilicon lands on a semiconductor base structure having active regions (21) of devices (T1,) and a plurality of polysilicon lines (23-1,) formed therein after completion of a set of Master Silica processing steps, said method further comprising the steps of:

a) depositing a first thick passivating layer (26/27) of a dielectric material that can be planarized not said semiconduction base structure;

b) forming a plurality of first stud openings (28-1,) in said first thick passivating layer exposing at least one of said active regions (21) and said polysilicon lines (23-1,);

c) depositing a first layer (30) of a conductive material to fill said first stud openings (28-1,) and define a set of first contact studs (30-1,);

d) planarizing said deposited layers to make a top surface of said first contact studs (30-1,) coplanar with said first thick passivating layer (26/27);

e) depositing a polysilicon layer (31) over the planarized top surface;

f) patterning said polysilicon layer (31) to define a plurality of resistive polysilicon lands (31-1,) contacting a plurality of said first contact studs (30-1,);

g) depositing a second thick passivating layer (34/35) of a dielectric material that can be planarized onto the patterned polysilicon layer;

h) forming a plurality of second and stud openings (28-1',) in said second thick passivating layer (34/35), said second stud openings exposing portions of said polysilicon lands (31-1,) and a plurality of first contact studs (30-1,);

i) depositing a second layer (37) of a conductive material to fill said second stud openings (28-1',) and define a plurality of second contact studs (37-1,);

j) planarizing said deposited second layers to make a top surface of said second contact studs (37-1,) coplanar with the surface of said second thick passivating layer (34/35); and, k) depositing an etch stop layer (25) prior to step a) of depositing the said first thick passivating layer (26/27).

2. The method of claim 1 further including the step of:

l) depositing a diffusion barrier layer onto the said base structure prior to step a).

3. The method of claim 2 wherein the material forming said etch stop layer (25) and said diffusion barrier layer is intrinsic polysilicon and $Si_3N_4$ respectively.

4. The method of claim 1 wherein step a) comprises the steps of:

a1) depositing a thick layer (26) of PSG;
a2) planarizing said thick layer of PSG;
a3) depositing a thin layer (27) of LPCVD oxide over the PSG layer (26) to act as a diffusion barrier.

5. The method of claim 1 wherein step g) comprises the steps of:

g1) depositing a thick layer (34) of PSG;
g2) planarizing said thick layer of PSG;
g3) depositing a thin layer (35) of either LPCVD oxide or PSG.

6. The method of claim 1 wherein said step e) consists of the deposition of intrinsic polysilicon and an additional step of ion implantation for resistivity adjustment.

7. The method of claim 1 further including the step of:

m) making highly conductive certain of said resistive polysilicon lands or portions thereof to be used as conductors prior to step g.

8. The method of claim 7 further including the step of:

n) forming a first protective cap layer (32) over the structure prior to step m).

9. The method of claim 8 wherein the material forming said cap layer (32) is a TEOS oxide.

10. The method of claim 8 wherein step m) of forming highly conductive polysilicon lands comprises the steps of:

m1) patterning said first protective cap layer (32) to expose determined portions (31-2) of said resistive polysilicon lands;

m2) converging by silicidation the exposed portions of said resistive polysilicon lands into polycide to produce conductive polysilicon lands (31-2').

11. The method of claim 11 further including the step of:

m3) forming a second protective cap layer (33) over the structure.

12. The method of claim 1 further including the steps of:

o) depositing a metal layer (38) onto the structure and patterning it to form metal lands (38-1) in contact with certain of said second contact studs (37-1);

p) depositing an insulating layer (39) onto the structure.

13. The method of claim 1 wherein said steps d) and j) of planarization are completed by chem-mech techniques.

14. The method of claim 1 wherein step c further comprises the steps of:

c) forming a Ti-TiN composite layer (29;36) on a bottom and side walls of said first and second stud openings (28; 28'); and, c2) filling the said openings with tungsten layer (30;37).

15. The method of claim 1 wherein the polysilicon layer deposited in step e is highly doped.

16. The method of claim 1 wherein the polysilicon layer deposited in step e is lightly doped.

17. The method of claim 15 wherein step i) further comprises the step of:

c1) forming a Ti-TiN composite layer (29;36) on a bottom and side walls of said first and second stud openings (28; 28'); and, c2) filling the said openings with a tungsten layer (30;37)

* * * * *